US010345874B1

(12) United States Patent
Narasimhan et al.

(10) Patent No.: US 10,345,874 B1
(45) Date of Patent: Jul. 9, 2019

(54) APPARATUS, SYSTEM, AND METHOD FOR DECREASING HEAT MIGRATION IN GANGED HEATSINKS (71) Applicant: Juniper Networks, Inc., Sunnyvale, CA (US)

(72) Inventors: Susheela Nanjunda Rao Narasimhan, Fremont, CA (US); Basavaraja Munishamappa, Bangalore (IN); Troy M. Sheets, San Francisco, CA (US); Luis Zamora, San Jose, CA (US); Seongchul C. Kim, Saratoga, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 37 days.

(21) Appl. No.: 15/144,612

(22) Filed: May 2, 2016

(51) Int. Cl.
*H05K 1/02* (2006.01)
*H05K 7/20* (2006.01)
*H01L 23/40* (2006.01)
*H01L 23/367* (2006.01)
*G06F 1/20* (2006.01)

(52) U.S. Cl.
CPC ............ *G06F 1/20* (2013.01); *H01L 23/3672* (2013.01); *H01L 23/4006* (2013.01); *H05K 1/0203* (2013.01); *H05K 7/2039* (2013.01); *H05K 7/20127* (2013.01); *H05K 7/20436* (2013.01); *H05K 7/20518* (2013.01)

(58) Field of Classification Search
CPC .. G06F 1/20; H05K 7/20436; H05K 7/20518; H01L 23/4006
See application file for complete search history.

(56) References Cited

U.S. PATENT DOCUMENTS 4,878,155 A * 10/1989 Conley ................. H01L 23/642
361/761
4,944,344 A * 7/1990 Crowe ................ F28D 15/0233
165/104.11
(Continued)

OTHER PUBLICATIONS

Buildcomputers.net, Power Consumption of PC Components in Watts Copyright © 2012-2016, http://www.buildcomputers.net/power-consumption-of-pc-components.html, buildcomputers.net, pp. 1-6.*
(Continued)

*Primary Examiner* — Robert J Hoffberg
(74) *Attorney, Agent, or Firm* — FisherBroyles, LLP (57) ABSTRACT The disclosed apparatus may include (1) a ganged heatsink base that (A) absorbs heat dissipated by a plurality of electronic components that consume differing amounts of power and (B) includes a plurality of thermal regions dedicated to absorbing the heat dissipated by the plurality of electronic components and (2) at least one thermal isolation engine that (A) is incorporated into the ganged heatsink base, (B) separates the plurality of thermal regions from one another, and (C) localizes the heat dissipated by the plurality of electronic components by maintaining at least some of the heat dissipated by one of the electronic components within the thermal region that absorbed the at least some of the heat such that the at least some of the heat does not migrate to another thermal region included in the ganged heatsink base. Various other apparatuses, systems, and methods are also disclosed.

19 Claims, 8 Drawing Sheets

(56) References Cited

U.S. PATENT DOCUMENTS

| | | | | |
|---|---|---|---|---|
| 5,168,348 A * | 12/1992 | Chu | H01L 23/367 | 257/713 |
| 5,180,942 A * | 1/1993 | Marvin | H03H 9/08 | 310/343 |
| 5,206,792 A * | 4/1993 | Reynolds | H01L 23/4006 | 257/713 |
| 5,243,218 A * | 9/1993 | Zenitani | H01L 23/4006 | 257/712 |
| 5,495,889 A * | 3/1996 | Dubelloy | F28F 3/12 | 165/104.33 |
| 5,602,392 A * | 2/1997 | Owen | H01L 27/14623 | 250/332 |
| 5,909,358 A * | 6/1999 | Bradt | H01L 23/4093 | 257/726 |
| 6,058,012 A * | 5/2000 | Cooper | G06F 1/203 | 165/80.3 |
| 6,388,882 B1 | 5/2002 | Hoover et al. | | |
| 6,626,233 B1 * | 9/2003 | Connors | F28D 15/0233 | 165/104.33 |
| 6,779,595 B1 * | 8/2004 | Chiang | H01L 23/427 | 165/104.33 |
| 6,807,058 B2 * | 10/2004 | Matteson | H01L 23/3672 | 165/185 |
| 6,940,164 B1 * | 9/2005 | Yoshimatsu | H01L 23/13 | 257/725 |
| 6,967,845 B2 * | 11/2005 | Chiang | H01L 23/427 | 165/80.3 |
| 7,120,027 B2 * | 10/2006 | Yatskov | H01L 23/4006 | 361/716 |
| 7,177,156 B2 * | 2/2007 | Yatskov | G06F 1/20 | 257/E23.083 |
| 7,277,286 B2 * | 10/2007 | Lee | H05K 7/209 | 174/15.2 |
| 7,310,226 B2 * | 12/2007 | Chen | H01L 23/4093 | 165/121 |
| 7,684,198 B2 * | 3/2010 | Fang | H01L 23/3672 | 165/185 |
| 7,719,842 B2 * | 5/2010 | Kreissig | H01L 23/4006 | 165/185 |
| 7,755,895 B2 * | 7/2010 | Ikeda | H01L 23/36 | 361/704 |
| 7,796,389 B2 * | 9/2010 | Edmunds | H01L 23/427 | 165/104.14 |
| 8,004,846 B2 * | 8/2011 | Okada | H01L 23/433 | 165/185 |
| 8,363,412 B2 * | 1/2013 | Budai | G06F 1/185 | 165/104.33 |
| 8,913,389 B2 * | 12/2014 | Fukui | H01L 23/367 | 174/548 |
| 9,159,642 B2 * | 10/2015 | Kim | H01L 23/3738 | |
| 9,167,723 B1 * | 10/2015 | Kim | H05K 7/20418 | |
| 9,198,328 B1 * | 11/2015 | Kokas | H05K 7/20518 | |
| 9,320,172 B2 * | 4/2016 | Newhouse | F28D 15/02 | |
| 9,743,555 B2 * | 8/2017 | Kim | H05K 7/20409 | |
| 2002/0005272 A1 * | 1/2002 | Hirano | H01L 23/467 | 165/80.3 |
| 2002/0015288 A1 | 2/2002 | Dibene, II et al. | | |
| 2002/0041486 A1 | 4/2002 | Hildebrandt | | |
| 2003/0181075 A1 | 9/2003 | Hartke et al. | | |
| 2004/0045730 A1 | 3/2004 | Garner | | |
| 2004/0104012 A1 | 6/2004 | Zhou et al. | | |
| 2004/0118142 A1 | 6/2004 | Hsu et al. | | |
| 2004/0218367 A1 * | 11/2004 | Lin | H05K 1/144 | 361/721 |
| 2004/0233636 A1 * | 11/2004 | Crippen | G06F 1/20 | 361/700 |
| 2004/0240180 A1 * | 12/2004 | Crippen | H01L 23/3672 | 361/700 |
| 2005/0168947 A1 | 8/2005 | Mok et al. | | |
| 2006/0005980 A1 | 1/2006 | Garner | | |
| 2006/0087814 A1 | 4/2006 | Brandon et al. | | |
| 2007/0115635 A1 | 5/2007 | Low et al. | | |
| 2007/0284089 A1 | 12/2007 | Vadakkanmaruveedu et al. | | |
| 2008/0084667 A1 | 4/2008 | Campbell et al. | | |
| 2008/0165502 A1 | 7/2008 | Furman et al. | | |
| 2009/0268403 A1 * | 10/2009 | Chen | G06F 1/203 | 361/692 |
| 2009/0268410 A1 * | 10/2009 | Kreissig | H01L 23/4006 | 361/719 |
| 2009/0323288 A1 * | 12/2009 | Bernard | G06F 1/20 | 361/715 |
| 2010/0128436 A1 | 5/2010 | Edmunds et al. | | |
| 2011/0108237 A1 * | 5/2011 | Kamath | H01L 23/4006 | 165/80.3 |
| 2011/0176278 A1 | 7/2011 | Park et al. | | |
| 2012/0206880 A1 | 8/2012 | Andres et al. | | |
| 2013/0208421 A1 | 8/2013 | Chester et al. | | |
| 2013/0208422 A1 | 8/2013 | Hughes et al. | | |
| 2014/0008756 A1 | 1/2014 | Pei et al. | | |
| 2014/0118920 A1 * | 5/2014 | Ng | G06F 1/20 | 361/679.33 |
| 2014/0247560 A1 | 9/2014 | Lemberg et al. | | |
| 2014/0268572 A1 | 9/2014 | Ranjan et al. | | |
| 2014/0293541 A1 | 10/2014 | Opila et al. | | |
| 2015/0009624 A1 | 1/2015 | Dunwoody et al. | | |
| 2015/0009631 A1 | 1/2015 | Joshi | | |
| 2015/0016062 A1 | 1/2015 | Robert | | |
| 2015/0092348 A1 * | 4/2015 | Newhouse | H05K 7/20336 | 361/694 |
| 2015/0093098 A1 * | 4/2015 | Fitton | F04D 25/08 | 392/367 |
| 2015/0289410 A1 | 10/2015 | Salat et al. | | |
| 2015/0323262 A1 | 11/2015 | Kim | | |
| 2015/0373827 A1 * | 12/2015 | Guo | H05K 1/0201 | 361/704 |
| 2016/0270255 A1 * | 9/2016 | Duncan | H05K 7/20209 | |
| 2017/0352605 A1 * | 12/2017 | Bilan | F21V 29/507 | |
| 2018/0249591 A1 * | 8/2018 | Audemar | H05K 7/209 | |

OTHER PUBLICATIONS

Wikipedia, Operating temperature, Sep. 26, 2010, https://web.archive.org/web/20100926001547/http://en.wikipedia.org/wiki/Operating_temperature, pp. 1-3.*

Heat pipe, https://en.wikipedia.org/wiki/Heat_pipe, pp. 1-14, as accessed on Jan. 29, 2017.

Travis S. Mikjaniec, et al; Apparatus, System, and Method for Improved Heat Spreading in Heatsinks; U.S. Appl. No. 15/432,195, filed Feb. 14, 2017.

* cited by examiner

APPARATUS, SYSTEM, AND METHOD FOR DECREASING HEAT MIGRATION IN GANGED HEATSINKS

BACKGROUND

The power dissipation of electronic components within network devices (such as routers and/or switches) has increased significantly over the last several years. For example, the power dissipation of Application-Specific Integrated Circuits (ASICs) in network devices has increased from approximately 10-15 watts to approximately 100-150 watts over the last 15 years. Similarly, the power dissipation of memory devices in such network devices has increased from approximately 1-2 watts to approximately 5-10 watts over the same timespan.

In contrast, the amount of space (sometimes referred to as real estate) available on such network devices has decreased significantly over the last several years. For example, while the power dissipation of ASICs in network devices has increased tenfold over the last 15 years, the real estate available on circuit boards and chasses within such network devices has decreased due to the high demand for miniaturization and additional network bandwidth. Likewise, the real estate available on racks and/or data centers that house such network devices has decreased for the same reasons.

Unfortunately, the performance of the electronic components within network devices may be impaired as the operating temperature of these components rises beyond a certain level. The operating temperature of these components may directly correlate to the amount of power dissipated by the same. For example, the operating temperature of an ASIC or memory device may increase in conjunction with the amount of power dissipated by the ASIC or memory device.

In an effort to maintain the operating temperature of the electronic components within a certain level to achieve optimal performance, network device designers may apply heatsinks to some of the electronic components. These heatsinks may absorb heat produced by the electronic components, thereby cooling the same. These heatsinks typically make physical contact with the electronic components by way of screws, spacers, and/or standoffs that mount to holes incorporated into the circuit board that includes the electronic components.

Unfortunately, these holes may consume real estate that can no longer be used by signals, buses, and/or electronic components on the circuit board. As a result, network device designers may want to minimize the number of holes incorporated into the circuit board. One tradeoff of minimizing the number of holes, however, may be a decrease in the structural stability of the heatsinks' mounting, which potentially leads to poorer contact between the heatsinks and the electronic components. Such poor contact may weaken the effectiveness of the heatsinks by impairing their heat transfer capabilities.

In an effort to address the heat produced by the electronic components and also achieve sufficient structural stability of the heatsinks' mounting, network device designers may consolidate at least some of the heatsinks into a single ganged heatsink that makes contact with multiple electronic components simultaneously. Unfortunately, traditional ganged heatsinks may lead to heat migration that involves heat produced by one electronic component migrating to another region dedicated to absorbing heat produced by another electronic component. Such heat migration may cause networking and/or performance problems in the event that the electronic component to which the other region corresponds is sensitive to temperature changes.

The instant disclosure, therefore, identifies and addresses a need for additional and improved apparatuses, systems, and methods for decreasing heat migration in ganged heatsinks.

SUMMARY

As will be described in greater detail below, the instant disclosure generally relates to apparatuses, systems, and methods for decreasing heat migration in ganged heatsinks. In one example, an apparatus for accomplishing such a task may include (1) a ganged heatsink base that (A) absorbs heat dissipated by a plurality of electronic components that consume differing amounts of power and (B) includes a plurality of thermal regions dedicated to absorbing the heat dissipated by the plurality of electronic components and (2) at least one thermal isolation engine that (A) is incorporated into the ganged heatsink base, (B) separates the plurality of thermal regions from one another, and (C) localizes the heat dissipated by the plurality of electronic components by maintaining at least some of the heat dissipated by one of the electronic components within the thermal region that absorbed the at least some of the heat such that the at least some of the heat does not migrate to another thermal region included in the ganged heatsink base.

Similarly, a ganged heatsink incorporating the above-described apparatus may include (1) a base that (A) absorbs heat dissipated by a plurality of electronic components that consume differing amounts of power and are disposed on a circuit board of a network device and (B) includes a plurality of thermal regions dedicated to absorbing the heat dissipated by the plurality of electronic components, (2) at least one thermal isolation engine that (A) separates the plurality of thermal regions from one another and (B) localizes the heat dissipated by the plurality of electronic components by maintaining at least some of the heat dissipated by one of the electronic components within the thermal region that absorbed the at least some of the heat such that the at least some of the heat does not migrate to another thermal region included in the base, and (3) one or more mounts that enable the base to couple to the circuit board of the network device that facilitates communication among computing devices within a network.

A corresponding method may include (1) perforating at least one trench into a ganged heatsink base to facilitate airflow that isolates a plurality of thermal regions of the ganged heatsink base that are dedicated to absorbing heat dissipated by a plurality of electronic components that are disposed on a circuit board of a network device and (2) coupling the ganged heatsink base to the circuit board of the network device by way of one or more mounts such that, when the plurality of electronic components are dissipating heat, the ganged heatsink base (A) absorbs the heat dissipated by the plurality of electronic components and (B) localizes the heat dissipated by the plurality of electronic components by (I) maintaining at least some of the heat dissipated by one of the electronic components within the thermal region that absorbed the at least some of the heat and (II) preventing the at least some of the heat from migrating to another thermal region of the ganged heatsink base.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for decreasing heat migration in ganged heatsinks. As will be explained in greater detail below, embodiments of the instant disclosure may successfully address and/or reconcile various design constraints of heatsinks that are applied to electronic components within network devices. For example, embodiments of the instant disclosure may enable a ganged heatsink to make contact with multiple electronic components within a network device by way of a minimal number of holes in the circuit board that includes the electronic components. By minimizing the number of holes needed to mount the ganged heatsink to the circuit board in this way, these embodiments may free up and/or make available certain real estate on the circuit board that would otherwise be consumed by additional holes.

Furthermore, embodiments of the instant disclosure may enable the ganged heatsink to localize the heat dissipated by the electronic components. For example, embodiments of the instant disclosure may divide the ganged heatsink into multiple thermal regions that are dedicated to absorbing the heat dissipated by different electronic components. These embodiments may achieve this division among the thermal regions by providing thermal isolation engines (such as perforated trenches) along the boundaries of the thermal regions. By providing such thermal isolation engines in this way, these embodiments may enable the ganged heatsink to maintain at least some of the heat dissipated by an electronic component (such as an ASIC) in the thermal region that absorbed the heat such that the heat does not migrate to another thermal region of the ganged heatsink.

Moreover, by maintaining the heat dissipated by the electronic component in isolation in this way, these embodiments may ensure that temperature-sensitive components (such as memory devices) will not be impaired by heat transferred from the thermal region corresponding to the electronic component. As a result, these embodiments may effectively reduce and/or regulate the operating temperature of those temperature-sensitive components and thus improve the performance and/or reliability of the network device.

Examples of this network device include, without limitation, routers (such as provider edge routers, hub routers, spoke routers, autonomous system boundary routers, and/or area border routers), switches, hubs, modems, bridges, repeaters, gateways, multiplexers, network adapters, network interfaces, network racks, chasses, servers, computing devices, portions of one or more of the same, combinations or variations of one or more of the same, and/or any other suitable network device.

The following will provide, with reference to FIGS. 1-7, detailed descriptions of exemplary apparatuses and corresponding implementations that decrease heat migration in ganged heatsinks. In addition, detailed descriptions of exemplary methods for decreasing heat migration in ganged heatsinks will be provided in connection with FIG. 8.

Figure 1:
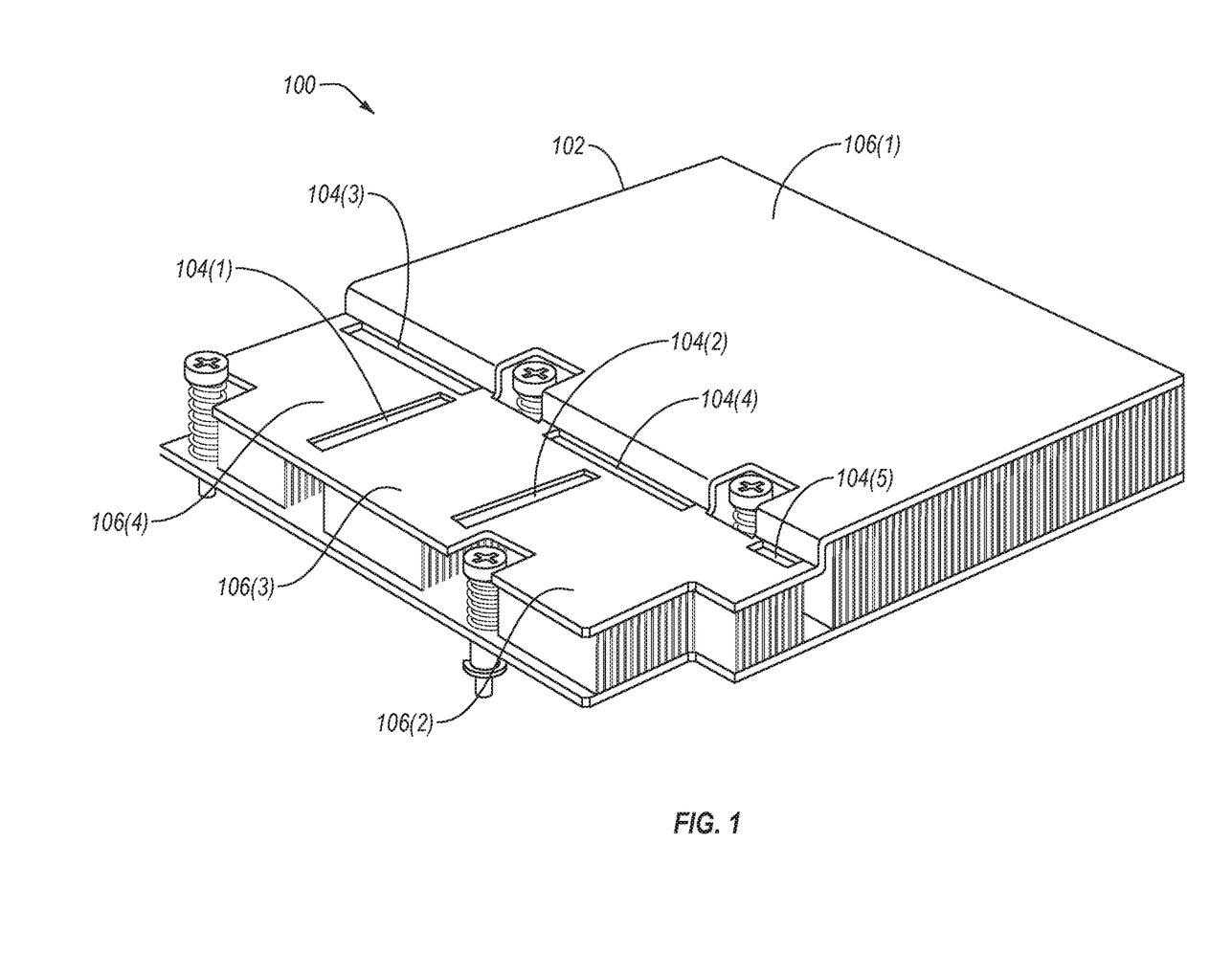
FIG. 1 is an illustration of an exemplary apparatus for decreasing heat migration in ganged heatsinks.

FIG. 1 shows an exemplary apparatus 100 for decreasing heat migration in ganged heatsinks. As illustrated in FIG. 1, apparatus 100 may include a ganged heatsink base 102 that absorbs heat dissipated by a plurality of electronic components that consume differing amounts of power and/or produce differing amounts of heat. The term "heatsink," as used herein, generally refers to any type or form of system, device, structure, and/or mechanism that conducts, transfers, absorbs, and/or sinks heat. Heatsinks may include and/or contain a variety of materials. Examples of such heatsink materials include, without limitation, copper, aluminum, copper, diamond, alloys of one or more of the same, combinations or variations of one or more of the same, and/or any other suitable materials.

As illustrated in FIG. 1, ganged heatsink base 102 may include a plurality of thermal regions 106(1), 106(2), 106(3), and 106(4). The term "ganged heatsink," as used herein, generally refers to any type or form of heatsink that facilitates and/or is designed to conduct, transfer, absorb, and/or sink heat dissipated by multiple electronic components simultaneously. The term "thermal region," as used herein, generally refers to any type or form of area, portion, range, and/or zone on a ganged heatsink. In some examples, thermal regions 106(1)-(4) may each represent and/or form a distinct portion of ganged heatsink base 102.

In one example, thermal regions 106(1)-(4) may each be dedicated to absorbing heat dissipated by a different electronic component. For example, thermal region 106(1) may be dedicated to absorbing heat dissipated by an ASIC included on a circuit board of a network device. In this example, thermal regions 106(2)-(4) may each be dedicated to absorbing heat dissipated by a different memory device (such as a hybrid memory cube) included on the circuit board of the network device.

As illustrated in FIG. 1, ganged heatsink base 102 may include thermal isolation engines 104(1), 104(2), 104(3), 104(4), and 104(5) that thermally isolate and/or separate thermal regions 106(1)-(4) from one another. The term "thermal isolation engine," as used herein, generally refers to any type or form of module, medium, and/or mechanism that mitigates and/or decreases the amount of heat transfer and/or migration that occurs across thermal regions of a ganged heatsink. In some examples, thermal isolation engines 104(1)-(5) may include and/or represent trenches, airways, and/or breathable membranes that are perforated, cut, and/or incorporated into ganged heatsink base 102.

In one example, thermal isolation engine 104(3) may help thermally isolate and/or separate thermal region 106(1) from thermal region 106(2) on ganged heatsink base 102. Similarly, thermal isolation engine 104(1) may help thermally isolate and/or separate thermal region 106(2) from thermal region 106(3) on ganged heatsink base 102. By thermally isolating and/or separating thermal regions 106(1) and 106(3) from thermal region 106(2) in this way, thermal isolation engines 104(1) and 104(3) may enable airflow to pass between thermal regions 106(2) and 106(3) as well as thermal regions 106(1) and 106(2).

Continuing with this example, the airflow may serve as an isolation medium that prevents heat from transferring and/or migrating from one of thermal regions 106(1)-(3) to another. As a result, the thermal region that absorbs the lowest amount of heat from its corresponding electronic component may remain at cooler temperatures than it otherwise would without any thermal isolation engines. However, the thermal region that absorbs the highest amount of heat from its corresponding electronic component may reach hotter temperatures than it otherwise would without any thermal isolation engines.

Accordingly, thermal isolation engines 104(1)-(5) may localize the heat dissipated by the electronic components by maintaining at least some of the heat dissipated by the electronic components within the thermal region that absorbed that portion of the heat. For example, thermal isolation engines 104(1) and 104(3) may cause some of the heat absorbed by thermal region 106(2) to remain within or around thermal region 106(2). In other words, thermal isolation engine 104(1) may prevent some of that heat from transferring and/or migrating from thermal region 106(2) to thermal region 106(3). Additionally or alternatively, thermal isolation engine 104(3) may prevent some of that heat from transferring and/or migrating from thermal region 106(2) to thermal region 106(1).

Similarly, thermal isolation engines 104(3) and 104(4) may cause some of the heat absorbed by thermal region 106(1) to remain within or around thermal region 106(1). In other words, thermal isolation engine 104(3) may prevent some of that heat from transferring and/or migrating from thermal region 106(1) to thermal region 106(2). Additionally or alternatively, thermal isolation engine 104(4) may prevent some of that heat from transferring and/or migrating from thermal region 106(1) to thermal region 106(3) or 106(4).

In some examples, ganged heatsink base 102 may include and/or contain one or more heat slugs. Additionally or alternatively, these heat slugs may be coupled to and/or embedded in ganged heatsink base 102. The term "heat slug," as used herein, generally refers to any type or form of heatsink structure and/or material that interfaces directly with an electronic component. In one example, these heat slugs may make and/or maintain contact with the electronic components to facilitate direct contact and/or heat transfer. In this example, these heat slugs may represent pieces and/or extensions of ganged heatsink base 102 that form thermal bridges enabling the heat dissipated by the electronic components to transfer.

The same thermal isolation concept may be implemented in an ASIC lid. For example, an ASIC may include multiple semiconductor dies on a single substrate and/or interposer. In this example, the ASIC may have a lid that includes, incorporates, and/or interfaces with an Integrated Heat Spreader (IHS). This IHS may include one or more thermal isolation engines that separate different thermal regions from one another. These isolation engines may localize the heat dissipated by the semiconductor dies within the thermal regions that absorbed the heat, thereby preventing the heat from migrating to another thermal region included in the IHS.

Figure 2:
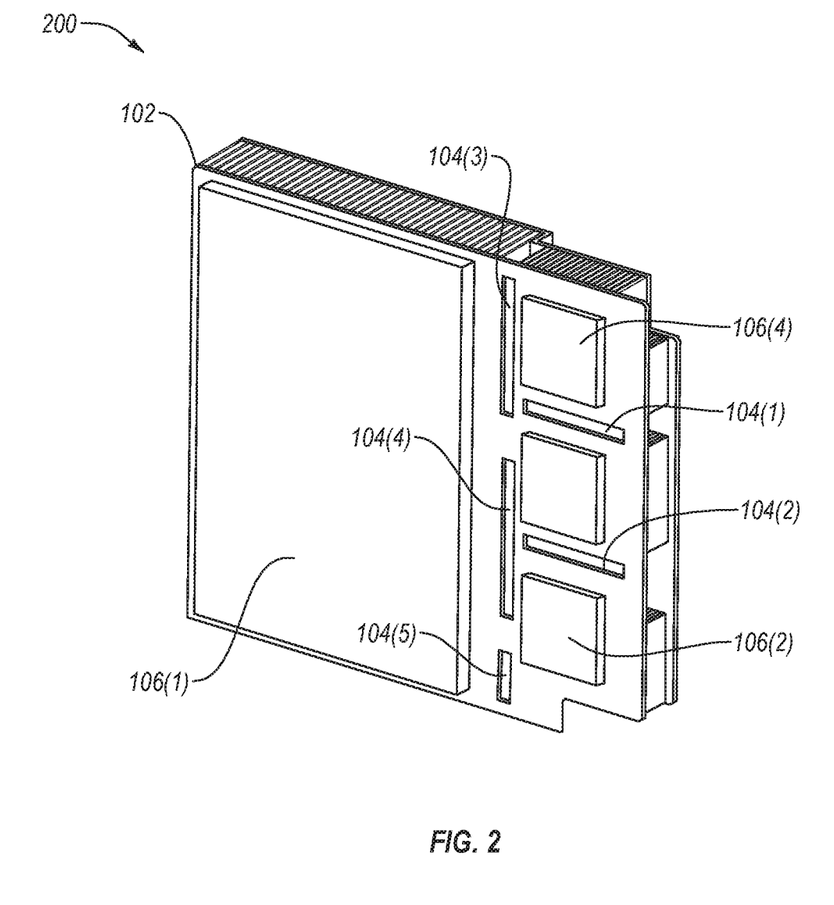
FIG. 2 is an illustration of an exemplary apparatus for decreasing heat migration in ganged heatsinks.

FIG. 2 shows an exemplary apparatus 200 for decreasing heat migration in ganged heatsinks. As illustrated in FIG. 2, apparatus 200 may include and/or represent the same apparatus that is illustrated in FIG. 1. However, FIG. 2 may present apparatus 200 in a view and/or perspective that is different than FIG. 1.

As illustrated in FIG. 2, apparatus 200 may include ganged heatsink base 102 that absorbs heat dissipated by a plurality of electronic components that consume differing amounts of power and/or generate differing amounts of heat. In this example, ganged heatsink base 102 may include thermal isolation engines 104(1)-(5) that thermally isolate and/or separate thermal regions 106(1)-(4) from one another. By thermally isolating and/or separating thermal regions 106(1)-(4) from one another in this way, thermal isolation engines 104(1)-(5) may enable airflow to pass among thermal regions 106(1)-(4).

Figure 3:
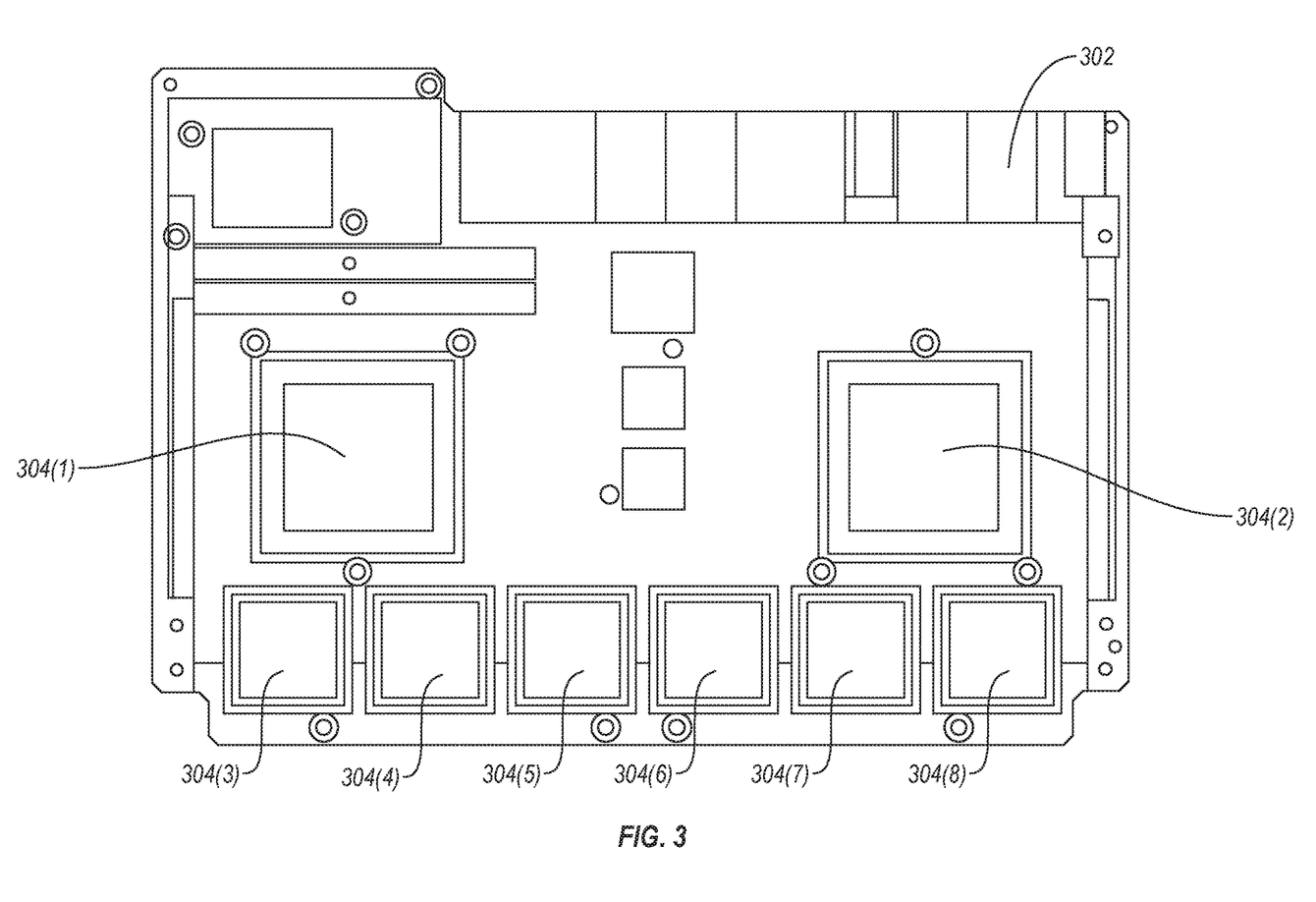
FIG. 3 is an illustration of an exemplary circuit board that includes a plurality of electronic components within a network device.

FIG. 3 shows an exemplary circuit board 302 from a top-down view and/or perspective. As illustrated in FIG. 3, circuit board 302 may include a plurality of electronic components 304(1), 304(2), 304(3), 304(4), 304(5), 304(6), 304(7), and 304(8). Examples of electronic components 304(1)-(8) include, without limitation, ASICs, memory devices (such as hybrid memory cubes), physical processors, packet forwarding engines, power regulators, semiconductors, integrated circuits, combinations or variations of one or more of the same, and/or any other suitable electronic components. In some examples, circuit board 302 may be included in and/or represent part of a field-replaceable unit within a network device that facilitates communication among computing devices across a network.

In one example, electronic components 304(1) and 304(2) may include and/or represent ASICs that facilitate processing and/or forwarding network traffic. In this example, the ASICs may each consume between 150 watts and 200 watts. Additionally or alternatively, the ASICs may each have a maximum temperature rating (e.g., a maximum junction temperature) of 125 degrees Celsius. Accordingly, the ASICs may begin malfunctioning in the event that their temperature rises above 125 degrees Celsius.

In one example, electronic components 304(3)-(8) may include and/or represent hybrid memory cubes that store data in connection with processing and/or forwarding network traffic. In this example, the hybrid memory cubes may each consume approximately 18 watts. Additionally or alternatively, the hybrid memory cubes may each have a maximum temperature rating (e.g., a maximum junction temperature) of 110 degrees Celsius. Accordingly, the hybrid memory cubes may begin malfunctioning in the event that their temperature rises above 110 degrees Celsius.

Continuing with this example, the hybrid memory cubes may have a significantly lower maximum temperature rating than the ASICs. As a result, in the event that a ganged heatsink is applied to at least a portion of circuit board 302, this ganged heatsink may benefit from having thermal isolation engines that separate the thermal regions dedicated to the corresponding electronic components of circuit board 302. In one example, a single ganged heatsink may be applied to all of electronic components 304(1)-(8) on circuit board 302. In another example, one ganged heatsink may be applied to electronic components 304(1) and 304(3)-(5), and another ganged heatsink may be applied to electronic components 304(2) and 304(6)-(8).

In some examples, circuit board 302 may strategically have a minimal number of holes designed to accept mounts that enable the ganged heatsink to couple to circuit board 302. For example, a network device designer may try to minimize the number of holes designed to serve as mounting receptacles for the ganged heatsink(s) on circuit board 302. By minimizing the number of holes in this way, the network device designer may be able to maximize the amount of usable real estate on circuit board 302. Similarly, the network device designer may try to minimize the number of connectors incorporated in and/or mounted to the ganged heatsink(s) to correspond to and/or match the minimal number of holes on circuit board 302 and/or maximize the surface area of the heatsink(s). Accordingly, the ganged heatsink(s) may have a minimal number of mounts that enable the ganged heatsink(s) to couple to circuit board 302.

Figure 4:
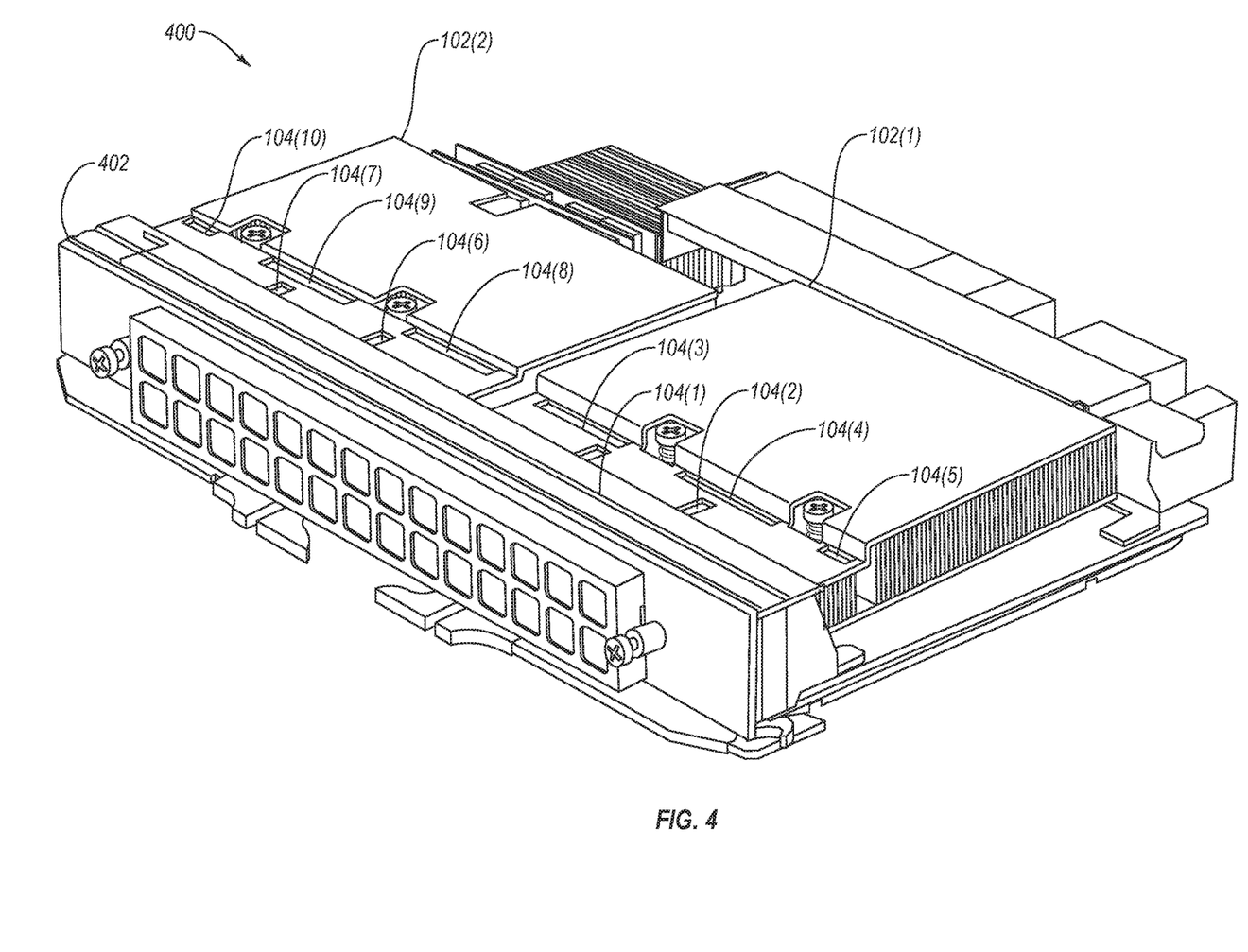
FIG. 4 is an illustration of an exemplary implementation of an apparatus for decreasing heat migration in ganged heatsinks.

FIG. 4 shows an exemplary implementation 400 that includes a field-replaceable unit 402. The term "field-replaceable unit," as used herein, generally refers to any type or form of circuit board designed to be replaceable in and/or removable from a network device after deployment at a network site. Examples of field-replaceable unit 402 include, without limitation, Physical Interface Cards (PICS), Flexible PIC Concentrators (FPCs), line cards, Switch Interface Boards (SIBS), control boards, routing engines, communication ports, fan trays, connector interface panels, combinations or variations of one or more of the same, or any other suitable field-replaceable unit. In one example, field-replaceable unit 402 may include and/or represent an FPC.

As illustrated in FIG. 4, field-replaceable unit 402 may include a circuit board (such as circuit board 302 in FIG. 3) that includes a plurality of electronic components (not necessarily visible in FIG. 4). In this example, field-replaceable unit 402 may also include ganged heatsink base 102(1) that is applied to certain electronic components on the circuit board. Field-replaceable unit 402 may further include ganged heatsink base 102(2) that is applied to other electronic components on the circuit board. This configuration may enable ganged heatsink bases 102(1) and 102(2) to make physical contact with the electronic components to facilitate absorbing heat dissipated by the electronic components during operation.

As illustrated in FIG. 4, ganged heatsink base 102(1) may include thermal isolation engines 104(1)-(5), and ganged heatsink base 102(2) may include thermal isolation engines 104(6)-(10). In this example, ganged heatsink base 102(1) may absorb the heat dissipated by the corresponding electronic components on the circuit board. Thermal isolation engines 104(1)-(5) may localize the heat absorbed by certain thermal regions of ganged heatsink base 102(1) such that the heat does not migrate or transfer from one thermal region to another. By localizing the heat absorbed by those thermal regions in this way, thermal isolation engines 104(1)-(5) may enable the more temperature-sensitive electronic components to operate at cooler temperatures and avoid heating up beyond their maximum junction temperature.

Similarly, ganged heatsink base 102(2) may absorb the heat dissipated by the corresponding electronic components on the circuit board. Thermal isolation engines 104(5)-(10) may localize the heat absorbed by certain thermal regions of ganged heatsink base 102(2) such that the heat does not migrate or transfer from one thermal region to another. By localizing the heat absorbed by those thermal regions in this way, thermal isolation engines 104(5)-(10) may enable the more temperature-sensitive electronic components to operate at cooler temperatures and avoid heating up beyond their respective maximum junction temperatures.

In some examples, thermal isolation engines 104(1)-(10) may be modeled to ensure that the corresponding electronic components operate within (e.g., in compliance with) their respective temperature ratings. For example, a network device designer may create a model (whether physical or virtual) of ganged heatsink base 102(1) as part of the design process for a network device. In this example, the network device designer may experiment with the model by changing various characteristics (such as size, shape, and/or location) of thermal isolation engines 104(1)-(5) with respect to ganged heatsink base 102(1). The network device designer may continue with this experimentation until discovering and/or reaching a result that satisfies the needs and/or design constraints of the corresponding electronic components whose heat is absorbed by ganged heatsink base 102(1).

Figure 5:
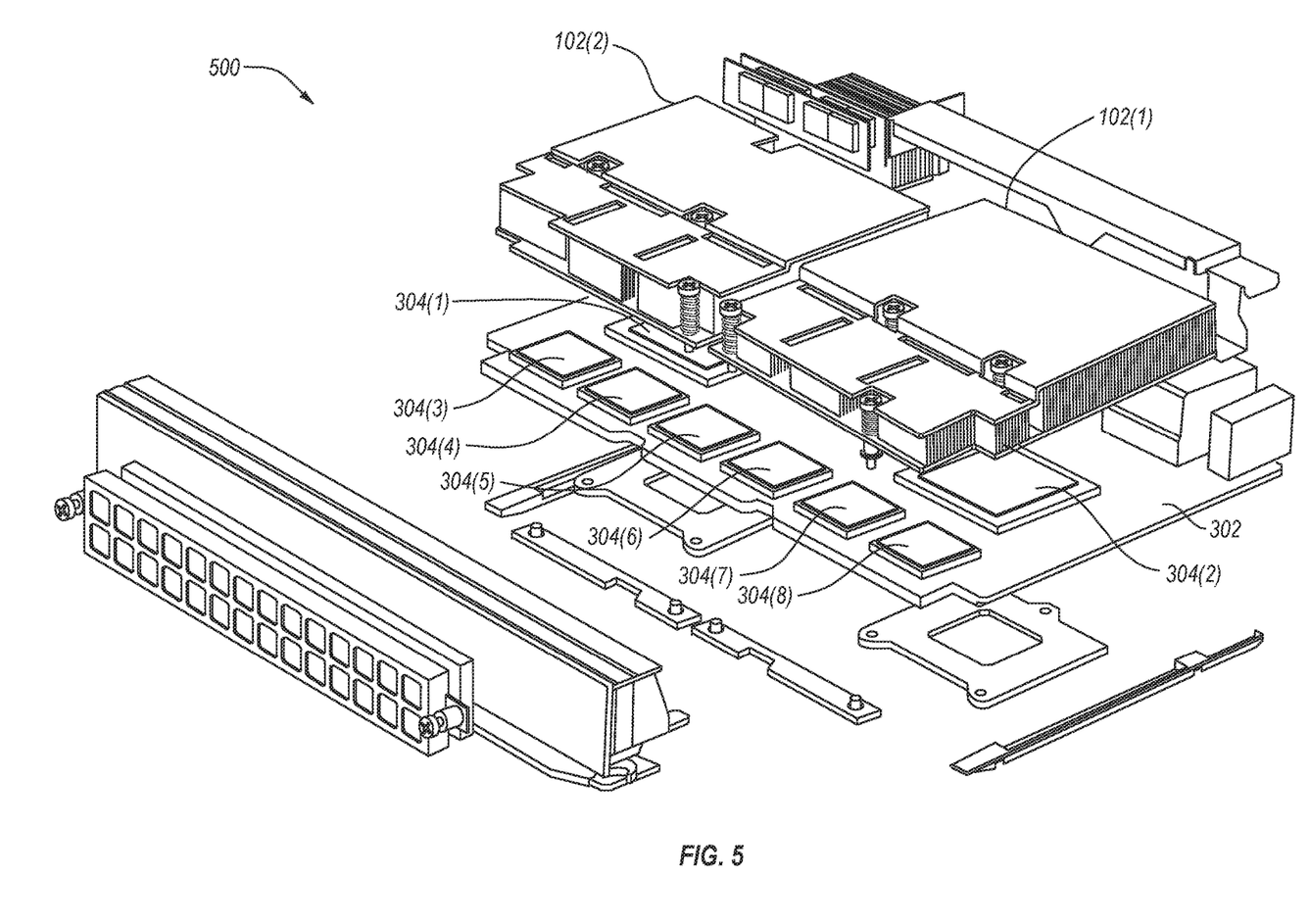
FIG. 5 is an illustration of an exploded view of an exemplary implementation of an apparatus for decreasing heat migration in ganged heatsinks.

FIG. 5 shows an exemplary implementation 500 that includes field-replaceable unit 402 in an exploded view and/or perspective. As illustrated in FIG. 5, ganged heatsink base 102(1) may be mounted to circuit board 302 by way of screws, spacers, and/or standoffs. This mounting may enable ganged heatsink base 102(1) to make and/or maintain physical contact with electronic components 304(2) and 304(6)-(8). As a result, ganged heatsink base 102(1) may be able to absorb heat dissipated by electronic components 304(2) and 304(6)-(8) to facilitate cooling the same. Moreover, the thermal isolation engines (not explicitly referenced in FIG. 5) of ganged heatsink base 102(1) may effectively localize the heat at the thermal regions where the heat is absorbed.

As illustrated in FIG. 5, ganged heatsink base 102(2) may also be mounted to circuit board 302 by way of screws, spacers, and/or standoffs. This mounting may enable ganged heatsink base 102(2) to make and/or maintain physical contact with electronic components 304(1) and 304(3)-(5). As a result, ganged heatsink base 102(2) may be able to absorb heat dissipated by electronic components 304(1) and 304(3)-(5) to facilitate cooling the same. Moreover, the thermal isolation engines (not explicitly referenced in FIG. 5) of ganged heatsink base 102(2) may effectively localize the heat at the thermal regions where the heat is absorbed.

Figure 6:
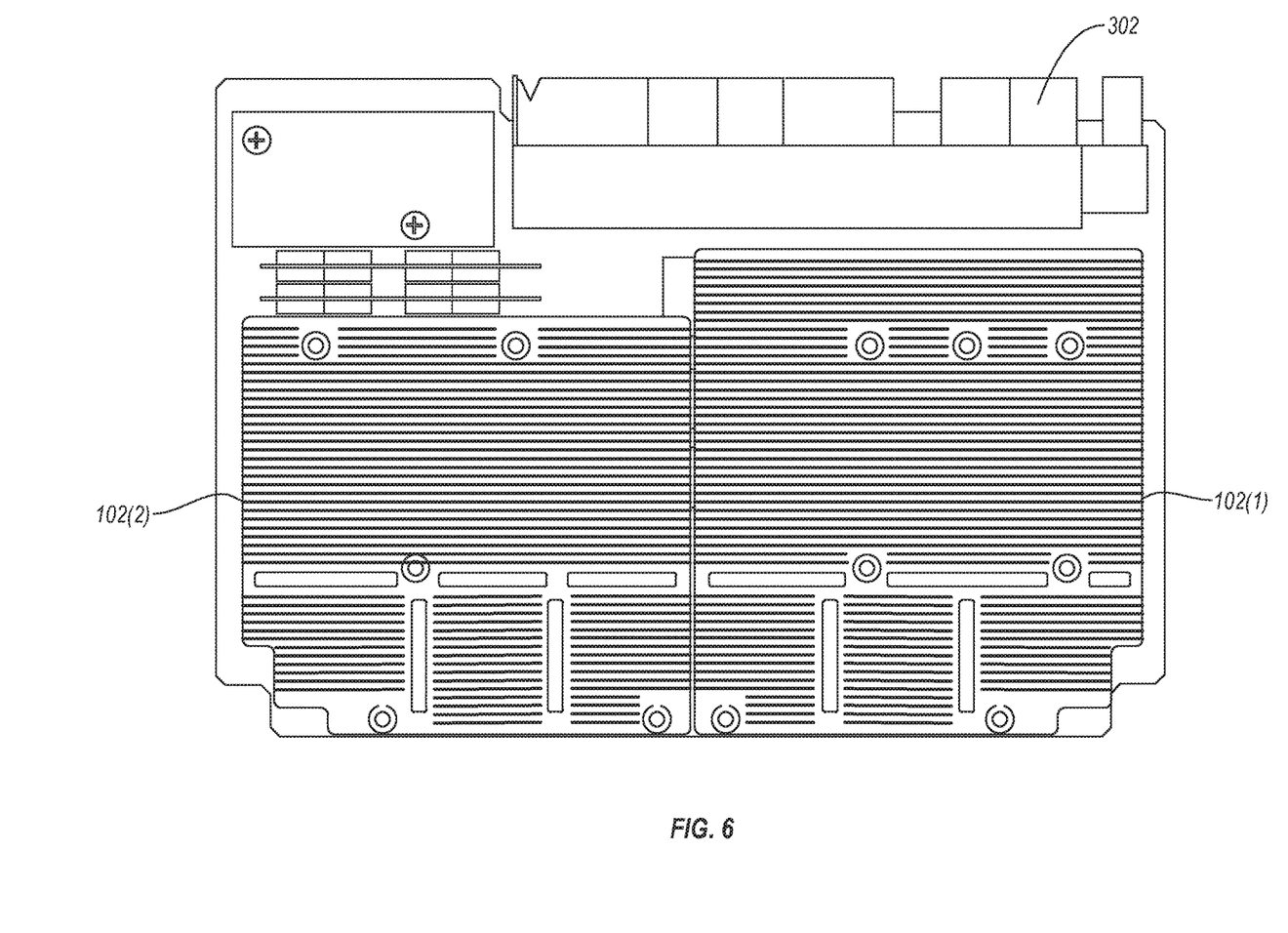
FIG. 6 is an illustration of an exemplary implementation of an apparatus for decreasing heat migration in ganged heatsinks.

FIG. 6 shows an exemplary implementation 600 that includes ganged heatsink bases 102(1) and 102(2) from a top-down view and/or perspective. As illustrated in FIG. 6, ganged heatsink base 102(1) may be mounted to circuit board 302 by way of screws, spacers, and/or standoffs. This mounting may enable ganged heatsink base 102(1) to make and/or maintain physical contact with the corresponding electronic components of circuit board 302. As a result, ganged heatsink base 102(1) may be able to absorb heat dissipated by those electronic components to facilitate cooling the same. Moreover, the thermal isolation engines (not explicitly referenced in FIG. 6) of ganged heatsink base 102(1) may effectively localize the heat at the thermal regions where the heat is absorbed.

As illustrated in FIG. 6, ganged heatsink base 102(2) may also be mounted to circuit board 302 by way of screws, spacers, and/or standoffs. This mounting may enable ganged heatsink base 102(2) to make and/or maintain physical contact with the corresponding electronic components of circuit board 302. As a result, ganged heatsink base 102(2) may be able to absorb heat dissipated by those electronic components to facilitate cooling the same. Moreover, the thermal isolation engines (not explicitly referenced in FIG. 6) of ganged heatsink base 102(2) may effectively localize the heat at the thermal regions where the heat is absorbed.

Figure 7:
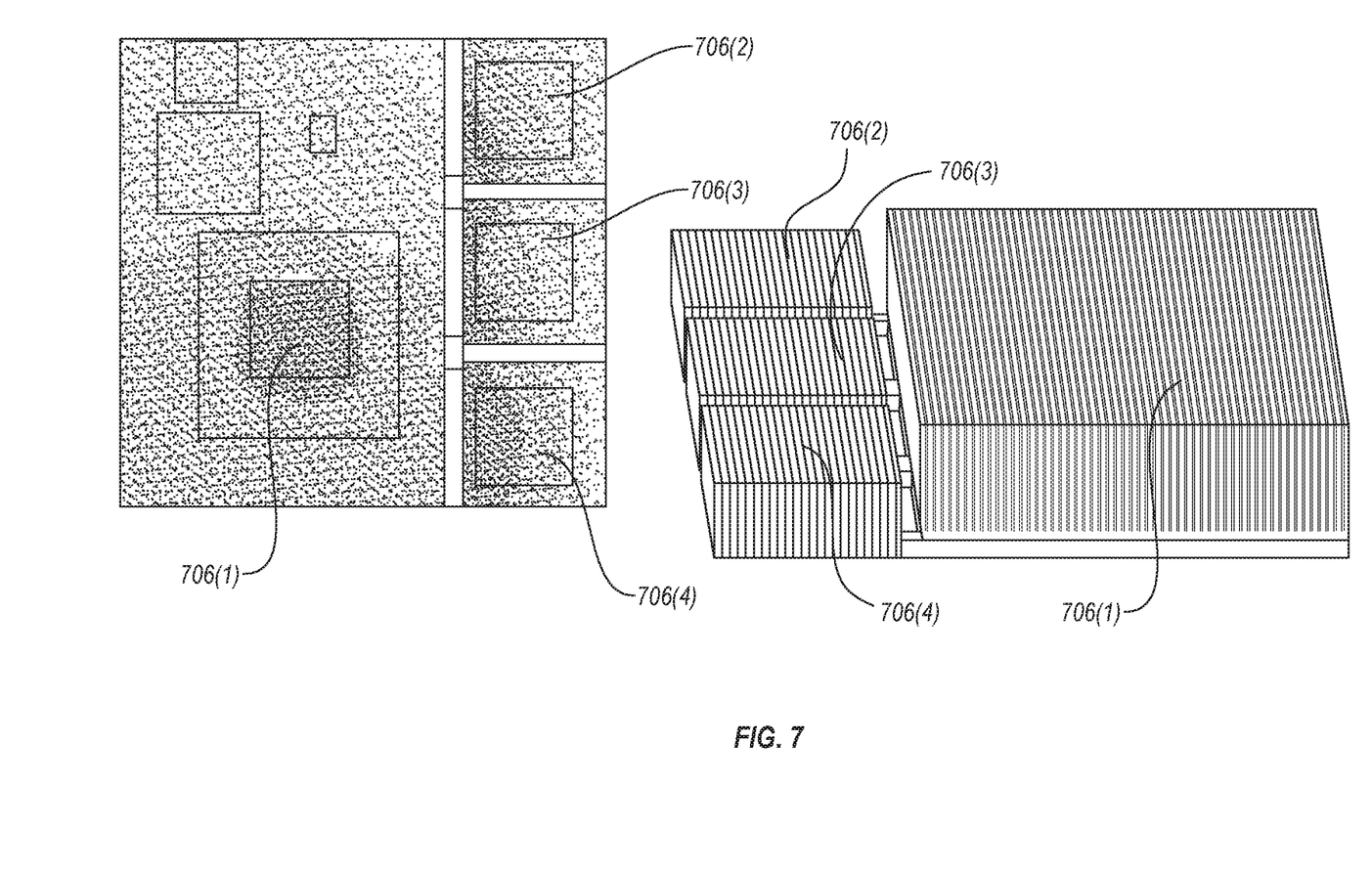
FIG. 7 is an illustration of an exemplary heatmap representation demonstrating the temperatures of different thermal regions of a ganged heatsink.

FIG. 7 shows an exemplary heatmap representation 700 that demonstrates the temperatures of different thermal regions of a ganged heatsink. As illustrated in FIG. 7, heatmap representation 700 may include a graphical representation 706(1) of the temperature at thermal region 106(1) of ganged heatsink base 102 (not necessarily illustrated in FIG. 7). In this example, heatmap representation 700 may also include a graphical representation 706(2) of the temperature at thermal region 106(2) of ganged heatsink base 102. Heatmap representation 700 may further include a graphical representation 706(3) of the temperature at thermal region 106(3) of ganged heatsink base 102. Finally, heatmap representation 700 may include a graphical representation 706(4) of the temperature at thermal region 106(4) of ganged heatsink base 102.

In one example, graphical representation 706(1) may identify and/or represent the temperature of thermal region 106(1) as being approximately 97.7 degrees Celsius. In this example, graphical representation 706(2) may identify and/or represent the temperature of thermal region 106(2) as being approximately 83.6 degrees Celsius. Similarly, graphical representation 706(3) may identify and/or represent the temperature of thermal region 106(3) as being approximately 80.6 degrees Celsius. Finally, graphical representation 706(4) may identify and/or represent the temperature of thermal region 106(4) as being approximately 82.3 degrees Celsius.

However, if ganged heatsink base 102 did not include thermal isolation engines 104(1)-104(5), the heatmap representation would indicate and/or represent very different temperatures. For example, if ganged heatsink base 102 did not include thermal isolation engines 104(1)-104(5), the heatmap representation may indicate and/or represent the temperature of thermal region 106(1) as being approximately 95.2 degrees Celsius, the temperature of thermal region 106(2) as being approximately 86.9 degrees Celsius, the temperature of thermal region 106(3) as being approximately 86.1 degrees Celsius, and the temperature of thermal region 106(4) as being approximately 87.3 degrees Celsius.

Accordingly, heatmap representation 700 in FIG. 7 may demonstrate that thermal isolation engines 104(1)-104(5) are able to localize the heat absorbed by thermal regions 106(1)-(4) by preventing heat from migrating from thermal region 106(1) to thermal regions 106(2), 106(3), and/or 106(4). By localizing the heat absorbed by thermal regions 106(1)-(4) in this way, thermal isolation engines 104(1)-(5) may enable the corresponding electrical components on the circuit board to operate within their safe operating temperatures and thus achieve better performance and/or reliability.

Figure 8:
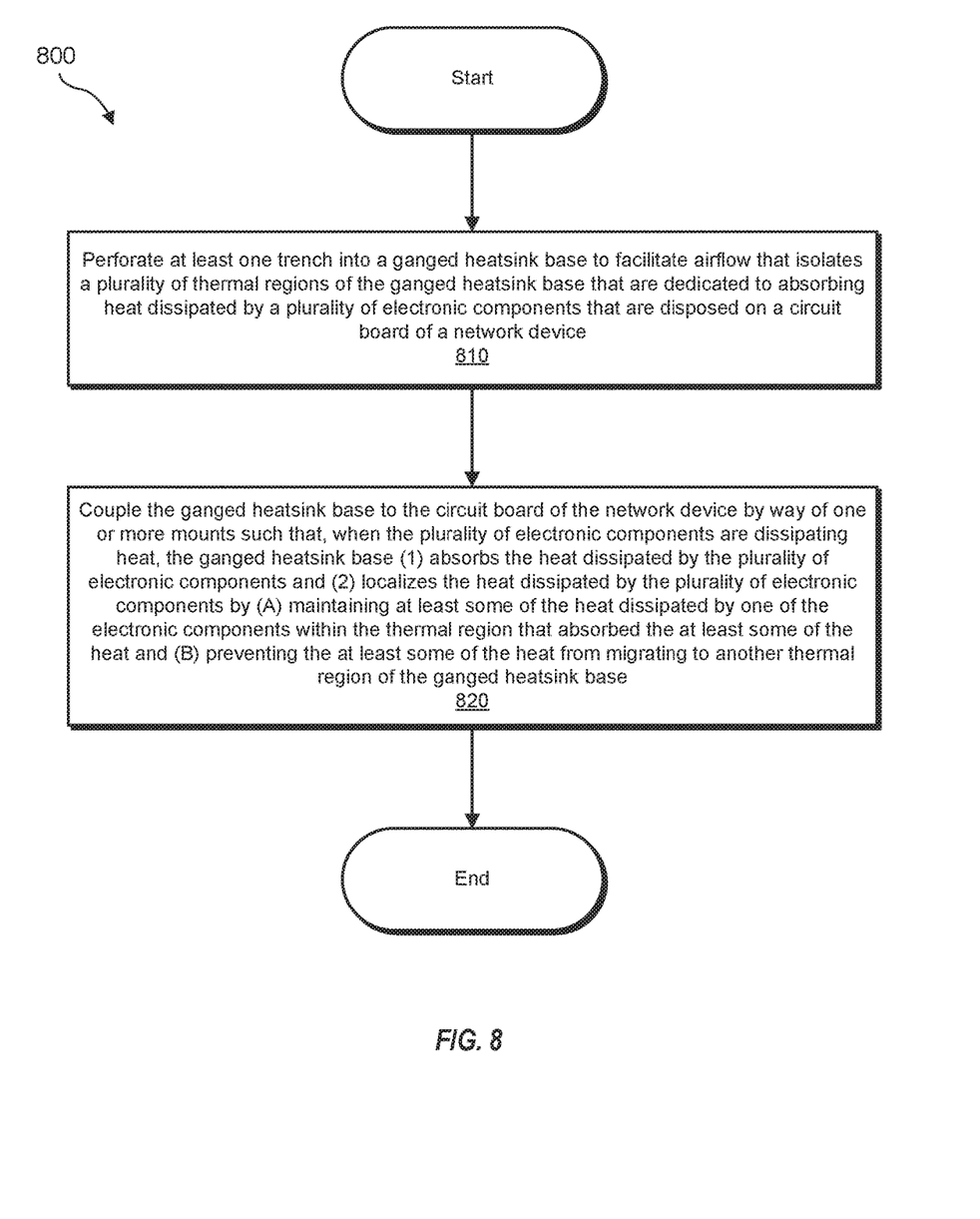
FIG. 8 is a flow diagram of an exemplary method for decreasing heat migration in ganged heatsinks.

FIG. 8 is a flow diagram of an exemplary method 800 for decreasing heat migration in ganged heatsinks. Method 800 may include the step of perforating at least one trench into a ganged heatsink base to facilitate airflow that isolates a plurality of thermal regions of the ganged heatsink base that are dedicated to absorbing heat dissipated by a plurality of electronic components that are disposed on a circuit board of a network device (810). This perforating step may be performed in a variety of ways. For example, a network equipment manufacturer may manufacture a network device (such as a router or switch) that facilitates communication among computing devices. In this example, the network equipment manufacturer may perforate multiple trenches into ganged heatsink base 102.

These trenches may facilitate airflow that thermally isolates and/or separates thermal regions 106(1)-(4) of ganged heatsink base 102 from one another. In this example, thermal regions 106(1)-(4) may each be dedicated to absorbing heat dissipated by a different electronic component (such as an ASIC or hybrid memory cube) that is disposed on circuit board 302.

Returning to FIG. 8, method 800 may also include the step of coupling the ganged heatsink base to the circuit board of the network device by way of one or more mounts (820). This coupling step may be performed in a variety of ways. For example, a network equipment manufacturer may manually couple ganged heatsink base 102 to circuit board 302 of the network device by way of one or more mounts, connectors, and/or receptacles. Additionally or alternatively, the network device manufacturer may implement a robotic assembly system that controls a hardware-based robotic tool that couples ganged heatsink base 102 to circuit board 302 of the network device as directed and/or programmed by certain software and/or firmware modules.

Once ganged heatsink base 102 is coupled to circuit board 302 in this way, ganged heatsink base 102 may absorb heat dissipated by the electronic components disposed on circuit board 302. Ganged heatsink base 102 may also localize the heat dissipated by those electronic components. For example, ganged heatsink base 102 may maintain at least some of the heat dissipated by one of those electronic components within the thermal region that absorbed the heat and then prevent that heat from migrating to another thermal region of ganged heatsink base 102.

While the foregoing disclosure sets forth various embodiments using specific illustrations, flowcharts, and examples, each illustration component, flowchart step, operation, and/or component described and/or exemplified herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   a single ganged heatsink base that is designed to sink heat, wherein the single ganged heatsink base:
      absorbs heat dissipated by a plurality of electronic components that each consume differing amounts of power;
      includes a number of thermal regions dedicated to absorbing the heat dissipated by the plurality of electronic components, wherein the number of thermal regions is equal to three or more;
      includes a top plate and a bottom plate; and
      includes a fin structure that resides between the top plate and the bottom plate and is coupled to the top plate and the bottom plate;
   a plurality of thermal isolation engines that:
      are incorporated into the single ganged heatsink base;
      separate the three or more thermal regions from one another;
      localize the heat dissipated by the plurality of electronic components by maintaining at least some of the heat dissipated by one of the electronic components within a thermal region that absorbed the at least some of the heat such that the at least some of the heat does not migrate to another thermal region included in the single ganged heatsink base, wherein the thermal region and the another thermal region are included in the three or more thermal regions;
      and form airways through the top plate, the bottom plate, and the fin structure to facilitate airflow that isolates the at least some of the heat at the thermal region that absorbed the at least some of the heat; and
   a number of mounts that enable the single ganged heatsink base to couple to a circuit board of a network device that facilitates communication among computing devices within a network, wherein the number of mounts is equal to or less than the number of thermal regions.

2. The apparatus of claim 1, wherein at least one of the thermal isolation engines isolates the at least some of the heat by preventing the at least some of the heat from transferring from the thermal region that absorbed the at least some of the heat to the another thermal region.

3. The apparatus of claim 1, wherein the plurality of electronic components have respective temperature ratings that differ from one another.

4. The apparatus of claim 3, wherein the thermal isolation engines enable the plurality of electronic components to operate within the respective temperature ratings by isolating the at least some of the heat to the thermal region that absorbed the at least some of the heat.

5. The apparatus of claim 3, wherein the thermal isolation engines are modeled to ensure that the plurality of electronic components operate within the respective temperature ratings by isolating the at least some of the heat at the thermal region that absorbed the at least some of the heat.

6. The apparatus of claim 3, wherein at least one of the thermal isolation engines comprises a trench that is perforated into the single ganged heatsink base to facilitate the airflow that isolates the at least some of the heat at the thermal region that absorbed the at least some of the heat.

7. The apparatus of claim 1, wherein the plurality of electronic components comprise at least one of:
   an Application-Specific Integrated Circuit (ASIC);
   a memory device; or
   a physical processor.

8. The apparatus of claim 1, further comprising a plurality of heat slugs that are coupled to the single ganged heatsink base and maintain physical contact with the plurality of electronic components to enable the single ganged heatsink base to absorb the heat dissipated by the plurality of electronic components.

9. The apparatus of claim 1, wherein each of the plurality of electronic components produce differing amounts of the heat.

10. A single ganged heatsink that is designed to sink heat, the single ganged heatsink comprising:
    a base that:
       absorbs heat dissipated by a plurality of electronic components that each consume differing amounts of power and are disposed on a circuit board of a network device;
       includes a number of thermal regions dedicated to absorbing the heat dissipated by the plurality of electronic components, wherein the number of thermal regions is equal to three or more;
       includes a top plate and a bottom plate; and
       includes a fin structure that resides between the top plate and the bottom plate and is coupled to the top plate and the bottom plate;
    a plurality of thermal isolation engines that:
       separate the three or more thermal regions from one another;
       localize the heat dissipated by the plurality of electronic components by maintaining at least some of the heat dissipated by one of the electronic components within a thermal region that absorbed the at least some of the heat such that the at least some of the heat does not migrate to another thermal region included in the base, wherein the thermal region and the another thermal region are included in the three or more thermal regions; and
       form airways through the top plate, the bottom plate, and the fin structure to facilitate airflow that isolates the at least some of the heat at the thermal region that absorbed the at least some of the heat; and
    a number of mounts that enable the base to couple to the circuit board of the network device that facilitates communication among computing devices within a network, wherein the number of mounts is equal to or less than the number of thermal regions.

11. The single ganged heatsink of claim 10, wherein at least one of the thermal isolation engines isolates the at least some of the heat by preventing the at least some of the heat from transferring from the thermal region that absorbed the at least some of the heat to the another thermal region.

12. The single ganged heatsink of claim 10, wherein the plurality of electronic components have respective temperature ratings that differ from one another.

13. The single ganged heatsink of claim 12, wherein the thermal isolation engines enable the plurality of electronic components to operate within the respective temperature ratings by isolating the at least some of the heat at the thermal region that absorbed the at least some of the heat.

14. The single ganged heatsink of claim 12, wherein the thermal isolation engines are modeled to ensure that the plurality of electronic components operate within the respective temperature ratings by isolating the at least some of the heat at the thermal region that absorbed the at least some of the heat.

15. The single ganged heatsink of claim 12, wherein at least one of the thermal isolation engines comprises a trench that is perforated into the base to facilitate the airflow that isolates the at least some of the heat to the thermal region that absorbed the at least some of the heat.

16. The single ganged heatsink of claim 10, wherein the plurality of electronic components comprise at least one of:
   an Application-Specific Integrated Circuit (ASIC);
   a memory device; or
   a physical processor.

17. The single ganged heatsink of claim 10, further comprising a plurality of heat slugs that are coupled to the base and maintain physical contact with the plurality of electronic components to enable the base to absorbs the heat dissipated by the plurality of electronic components.

18. The single ganged heatsink of claim 10, wherein each of the plurality of electronic components produce differing amounts of the heat.

19. A method comprising:
   perforating at least one trench into a single ganged heatsink base that:
      is designed to sink heat to facilitate airflow;
      isolates a number of thermal regions of the single ganged heatsink base that are dedicated to absorbing heat dissipated by a plurality of electronic components that are disposed on a circuit board of a network device, wherein the number of thermal regions is equal to three or more;
      includes a top plate and a bottom plate;
      includes a fin structure that resides between the top plate and the bottom plate and is coupled to the top plate and the bottom plate; and
      includes a plurality of thermal isolation engines that separate the three or more thermal regions from one another;
   coupling the single ganged heatsink base to the circuit board of the network device by way of a number of mounts that is equal to or less than the number of thermal regions such that, when the number of thermal regions absorb the heat dissipated by the plurality of electronic components, the thermal isolation engines of the single ganged heatsink base:
   localize the heat absorbed by the number of thermal regions by:
      maintaining at least some of the heat dissipated by one of the electronic components within a thermal region that absorbed the at least some of the heat; and
      preventing the at least some of the heat from migrating to another thermal region of the single ganged heatsink base, wherein the thermal region and the another thermal region are included in the three or more thermal regions; and
   forming the trench through the top plate, the bottom plate, and the fin structure to facilitate the airflow that isolates the at least some of the heat at the thermal region that absorbed the at least some of the heat.

* * * * *